United States Patent [19]

Ohashi

[11] Patent Number: 4,956,699
[45] Date of Patent: Sep. 11, 1990

[54] SIGNAL SYNCHRONIZING SYSTEM

[75] Inventor: Mitsuo Ohashi, Osaka, Japan

[73] Assignee: NEC Home Electronics Ltd., Osaka, Japan

[21] Appl. No.: 301,043

[22] Filed: Jan. 24, 1989

[30] Foreign Application Priority Data

Jan. 27, 1988 [JP] Japan .................................. 63-16572

[51] Int. Cl.⁵ ............................................ H04N 5/04
[52] U.S. Cl. .................................... 358/149; 375/107; 358/158
[58] Field of Search ............... 358/148, 149, 150, 152, 358/153, 154, 158; 375/107

[56] References Cited

U.S. PATENT DOCUMENTS 4,346,407 8/1982 Baer et al. ........................... 358/149
4,489,348 12/1984 Leply .................................. 358/149

FOREIGN PATENT DOCUMENTS 1226019 3/1971 United Kingdom .
1239298 7/1971 United Kingdom .
2175470 11/1986 United Kingdom .

Primary Examiner—John W. Shepperd
Assistant Examiner—Michael D. Parker
Attorney, Agent, or Firm—Cushman, Darby & Cushman

[57] ABSTRACT

A signal synchronizing system comprising first circuit having a plurality of sync signals, second circuit having a plurality of sync signals corresponding to the sync signals of the first circuit, respectively, and a synchronizing control circuit which synchronizes output signals of the second circuit with output signals of the first circuit. The synchronizing control circuit inputs the plurality of sync signals of each of the first and second circuits, and outputs a control signal to the second circuit.

8 Claims, 2 Drawing Sheets

SIGNAL SYNCHRONIZING SYSTEM

BACKGROUND OF THE INVENTION

The present invention relates to a signal synchronizing system, and more particularly to a system in which signals from two electrical circuits are precisely and automatically synchronized with each other.

Generally, while two electrical circuits each having a sync signal are operated, if signals of the two circuits are intended to be compared with each other, it is necessary to synchronize the sync signals between the two circuits. In this case, according to the conventional system, the sync signal of one of the circuit is inputted into the other circuit since such a synchronizing operation is simple.

However, the conventional system is disadvantageous in that the system would require an extra circuit for supplying the sync signal of one circuit to the other, or the system must be altered. Particularly, if a circuit is intended to be inspected by being compared with a reference good circuit, it has recently been required that signals from the circuit to be inspected should be synchronized with that of the reference circuit without any extra circuit for the synchronization. Such a requirement cannot be achieved by the conventional synchronizing system since the conventional system can synchronize merely one limited sync signal. Therefore, if the circuit to be inspected has a plurality of sync signals, the conventional synchronizing system cannot synchronize the sync signals with corresponding sync signals of the reference good circuit.

SUMMARY OF THE INVENTION

Accordingly, an object of the present invention is to eliminate the above-described problem accompanying a conventional synchronizing system. More specifically, an object of the invention is to provide a synchronizing system in which signals of two independent electrical circuits each having a plurality of sync signals can precisely and automatically be synchronized with each other.

The above and other objects are achieved by a provision of a synchronizing system, according to the present invention, in which a phase of a plurality of sync signals outputted from a first electrical circuit is compared with corresponding sync signals outputted from a second electrical circuit. That is, when a phase lock condition is detected with respect to first sync signals of the two electrical circuits, the first comparison stops and, subsequently, the next comparison with respect to second sync signals of the two circuits starts. Then, the last comparison in phase with respect to the last sync signals continues as judging that, during the comparison of the last sync signals, the two electrical circuits are completely synchronized with each other.

As described above, a phase of each of the plurality of sync signals of the first electrical circuit is compared with the corresponding signal of the second circuit. This phase comparison may starts from a sync signal which is the lowest in frequency. When the phase lock condition is detected as to the first sync signal having the lowest frequency, the first phase comparison stops and the next phase comparison as to the next lower frequency starts. A plurality of the phase comparisons are thus taken subsequently. Then the last phase comparison with respect to the last sync signal having the highest frequency continues.

Therefore, according to a synchronizing system of the present invention, a plurality of sync signals outputted from two independent electrical circuits are precisely and automatically synchronized with each other. Moreover, the present invention is advantageous in that if the system of the invention is applied to an inspection apparatus, the inspection can automatically be attained.

DESCRIPTION OF THE PREFERRED EMBODIMENTS

A preferred embodiment of the present invention will now be described in detail with reference to accompanying drawings.

Figure 1:
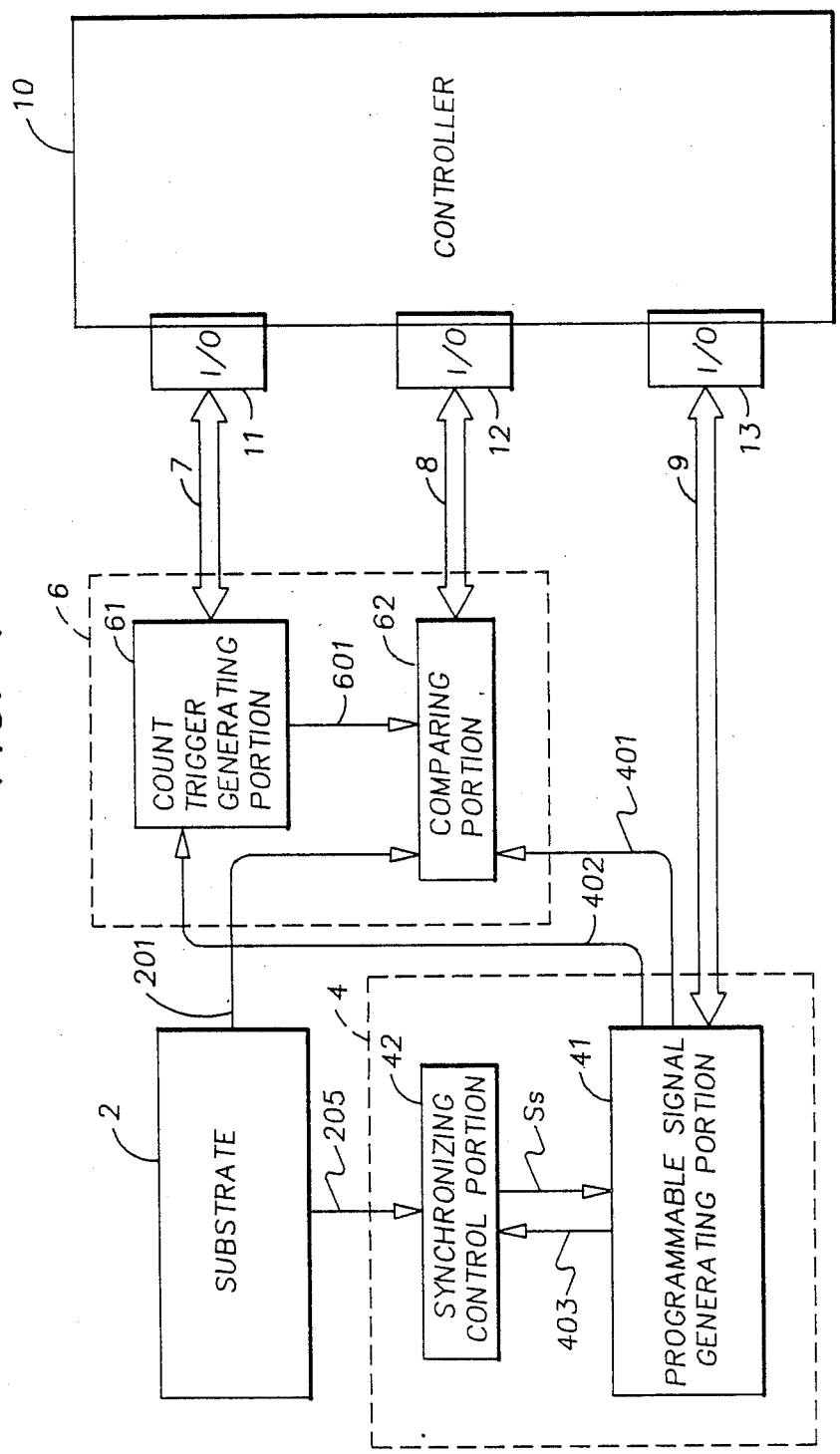
FIG. 1 is a block diagram showing a signal comparison inspection apparatus to which a system of the invention is applied.

FIG. 1 is a block diagram of a signal comparison inspection apparatus to which a signal synchronizing system according to an embodiment of the present invention is applied.

The signal comparison inspection apparatus shown in FIG. 1 is provided with a substrate 2, a signal source circuit 4, a comparing circuit 6, and a controller 10. An electrical circuit as a subject for the inspection is mounted on the substrate 2, which circuit outputs a subject image signal 201 and a sync signal 205. The substrate 2 is preset to be a predetermined condition after it is installed on a signal comparison inspection apparatus before it is actually inspected. After the inspection, the substrate 2 is moved from the inspection apparatus and transferred and, subsequently, the next electrical circuit is mounted on the substrate 2 for the inspection. The comparison inspection thus continues.

The signal source circuit 4 outputs a reference signal 401 which is the same as the subject image signal 201 outputted from the substrate 2. The signal source circuit 4 consists of a programmable signal generating portion 41 outputting the reference signal 401 and a synchronizing control portion 42 which synchronizes the reference signal 401 generated from the programmable signal generation portion 41 with the subject image signal 201 generated from the substrate 2.

The comparing circuit 6 receives as inputs the subject image signal 201 generated from the substrate 2 and the reference signal 401 generated from the signal source circuit 4. These signals are compared with each other, and a result of the comparison is stored in a comparating portion 62 of the comparing circuit 6 as a similarity rate. The comparing circuit 6 includes a count trigger generating portion 61 which generates a sampling clock 601 based on a sync signal 402 consisting of a horizontal sync signal H, a vertical sync signal V and a dot clock signal D. The comparing portion 62 operates the comparison under the sampling clock 601 and stores therein the result of the comparison.

The count trigger generating portion 61 of the comparing circuit 6 is connected through a signal line 7 to an input/output (I/O) board 11 of the controller 10 consisting of a computer. The controller 10 controls the operation of the whole inspection apparatus. The controller 10 is connected through an I/O board 12 and a signal line 8 to the comparing portion 62, and also connected through an I/O board 13 and a signal line 9 to the programmable signal generating portion 41 of the signal source circuit 4.

The signal comparison inspection apparatus shown in FIG. 1 is thus constructed, and the synchronizing control system including the synchronizing control portion 42 according to an embodiment of the present invention is applied to the inspection apparatus.

Figure 2:
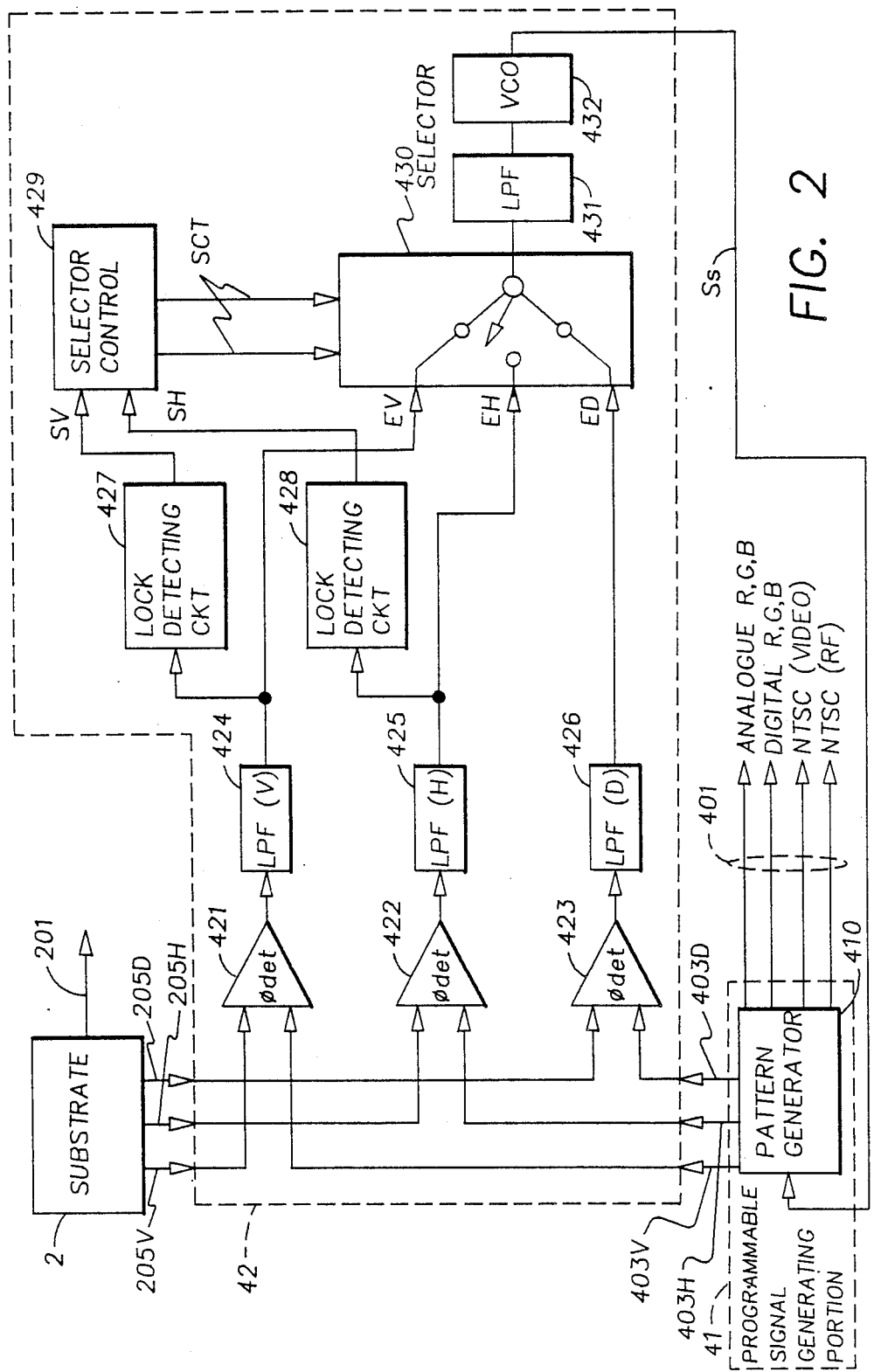
FIG. 2 is a circuit diagram showing a signal synchronizing system according to an embodiment of the present invention.

FIG. 2 is a circuit diagram showing a signal synchronizing system according to an embodiment of the present invention.

The embodiment of the invention shown in FIG. 2 is attained by providing the substrate 2 as a first circuit, the synchronizing control portion 42, and the programmable signal generating portion 41 as a second circuit. The synchronizing control part 42 inputs the sync signal 205 generated from the substrate 2, which signal consists of a horizontal sync signal 205H, a vertical sync signal 205V and a dot clock signal 205D. The synchronizing control portion 42 also inputs a sync signal 403 generated from the programmable signal generating portion 41, which signal consists of a horizontal sync signal 403H, a vertical sync signal 403V and a dot clock signal 403D.

The vertical sync signal 205V outputted from the substrate 2 and the vertical sync signal 403V outputted from the programmable signal generating portion 41 are supplied to a phase comparator 421 of the synchronizing control portion 42. The horizontal sync signal 205H outputted from the substrate 2 and the horizontal sync signal 403H outputted from the programmable signal generating portion 41 are supplied to a phase comparator 422 of the control circuit 42. Similarly, the dot clock signal 205D outputted from the substrate 2 and the dot clock signal 403D outputted from the programmable signal generating portion 41 are supplied to a phase comparator 423. Outputs of the phase comparators 421, 422 and 423 are supplied to low-pass filters 424, 425 and 426, respectively. These low-pass filters 424, 425 and 426 eliminate useless signal components. Outputs of the low-pass filters 424 and 425 are supplied to lock detecting circuits 427 and 428, respectively. Both an output signal SV of the lock detecting circuit 427 and an output signal SH of the lock detecting circuit 428 are supplied to a selector control circuit 429. The output signals of the low-pass filters 424 and 425 are also supplied to a selector 430 which is operated by selector control signals SCT generated by the selector control circuit 429. An output signal of the selector 430 is supplied through a low-pass filter 431 to a voltage control oscillator 432. An output signal of the voltage oscillator 432 is supplied to the programmable signal generating portion 41, which signal acts as a synchronizing control signal Ss. The synchronizing control signal Ss is supplied to a pattern generator 410 which is a part of the programmable signal generating portion 41. The pattern generator 410 outputs analogue R, G and B signals, digital R, G and B signals an NTSC (video) signal and an NTSC (RF) signal. An operation of the pattern generator 410 is disclosed, for example, in the magazine Transistor Technique, on pages 412 to 418, issued in Jan., 1987.

An operation of the signal source circuit 4 according to an embodiment of the present invention thus constructed will be described hereinbelow.

The substrate 2 is installed on the signal comparison inspection apparatus and set to be ready for actuating. Then, the substrate 2 outputs a subject image signal 201 acting as a subject signal. Simultaneously, the substrate 2 outputs sync signals 205H, 205V and 205D. At the time, the signal source circuit 4 outputs the reference signal 401 which is the same as the subject image signal 201 generated from the substrate 2 in accordance with the following process. The synchronizing control portion 42 of the signal source circuit 4 receives as inputs from the substrate 2 a sync signal consisting of a horizontal sync signal 205H, a vertical sync signal 205V and a dot clock signal 205D. The control portion 42 also receives as inputs from the programmable signal generating portion 41 a sync signal consisting of a horizontal sync signal 403H, a vertical sync signal 403V and a dot clock signal 403D. Then the synchronizing control part 42 supplies the synchronizing control signal Ss to the programmable signal generating portion 41 in order to eliminate a phase difference between the sync signals 205 and 403, so that the subject image signal 201 and the reference signal 401 outputted from the substrate 2 and the programmable signal generating portion 41, respectively, are synchronized with each other.

The operation of the synchronization above will be described in detail.

Assume now that, in an initial condition, the vertical sync signals 205V and 403V, the horizontal sync signals 205H and 403H, and the dot clock signals 205D and 403D are not synchronized with each other, respectively. Under this condition, the output signal SV of the lock detection circuit 427 is low in level so that the selector control circuit 429 outputs the selector control signal SCT thereby controlling the selector 430 to actuate an EV terminal connected to the low-pass filter 424. Then, the output signal of the phase comparator 421 is supplied to the voltage control oscillator 432 through the low-pass filter 424, the selector 430 and the low-pass filter 431. The voltage control oscillator 432 outputs a synchronizing control signal Ss thereby varying a frequency of the vertical sync signal 403V to substantially equalize it to that of the vertical sync signal 205V.

In this operation, if a difference in phase of the vertical sync signal 403V from the vertical sync signal 205V is within $\pm \frac{1}{2}H$ (one period of the horizontal sync signal), the output of the lock detection circuit 427 becomes high in level so that the selector control circuit 429 outputs a selector control signal SCT thereby actuating an EH terminal connected to the low-pass filter 425. Then, the output signal of the phase comparator 422 is supplied to the voltage control oscillator 432 through the low-pass filter 425, selector 430 and the low-pass filter 431. In this condition, the voltage control oscillator outputs the synchronizing control signal Ss thereby varying a frequency of the horizontal sync signal 403H to substantially equalize it to that of the horizontal sync signal 205H. If a difference in phase of the horizontal sync signal 403H from the horizontal sync signal 205H is within $\pm \frac{1}{2}H$, the output of the lock detection circuit 428 becomes high in level so that the selector control circuit 429 outputs a selector control signal SCT thereby actuating an ED terminal connected to the low-pass filter 426.

The sync signals are thus compared with each other and once a phase lock condition is detected as to the subject sync signal, the comparison of which is stopped. Accordingly, the signal source circuit 4 merely continues to compare the dot clock signal 403D with the dot clock signal 205D. Therefore, the sync signal 205 and the selector 430 are completely synchronized with each other. In other words, the output signal of the substrate 2 and that of the programmable signal generating portion 41 are completely synchronized with each other. After the synchronizing process is completed, the inspection subject, that is, the substrate 2 is actually inspected.

In an initial stage of the inspection process, an inspection time Ts is set by the controller 10 in the count trigger generating portion 61 of the comparating circuit 6. Further, a counter of the comparating part 62 of the comparating circuit 6 is cleared by the controller 10. A judgement level is also preset.

Next, the controller 10 supplies a command for starting the inspection to the count trigger generating portion 61 of the comparing circuit 6, so that the count trigger generating portion 61 outputs the sampling clock 601 to the comparing portion 62 thereby starting the inspection. The comparing portion 62 of the comparing circuit 6 counts up every time when the result of the comparison of the subject image signal 201 generated from the substrate 2 with the reference signal 401 generated from the signal source circuit 4 is logically 1. The inspection will end when the inspection time Ts set in the count trigger generating part 61 expired. During the inspection, a counter in the comparing portion 62 counts the dot numbers of the comparison judged as "NG" and sets them. When the inspection ends, the controller 10 reads out the count values set in the counter and judges whether the inspected substrate is to be "OK" or "NG". After that, the substrate 2 is removed from the apparatus and a new substrate is mounted in the signal comparison inspection apparatus for an inspection which repeats from the first step as described above.

According to the above-described embodiment, a plurality of sync signals of two independent circuits can precisely and completely be synchronized with each other. Although the above embodiment is directed to a signal comparison inspection apparatus, however, the invention is not limited thereto or thereby. That is, the present invention can be applied to any other systems in which a plurality of signals should be synchronized between two circuits.

As described above, according to the present invention, a plurality of sync signals of two electrical circuits separated from each other can precisely and automatically be synchronized with each other.

What is claimed is:

1. A signal synchronizing system, comprising:
    a first circuit having a plurality of sync output signals;
    a second circuit having a plurality of sync output signals corresponding to said sync signals of said first circuit; and
    means for receiving and synchronizing output signals from said first and second circuits and for generating a control signal to said second circuit, said synchronizing means comprising:
    a plurality of phase detectors corresponding to each of said sync signals of each of said first and second circuits;
    a selecting means for selecting outputs of said phase detectors;
    at least one lock condition detecting means connected to one of said phase detectors;
    means for controlling said selecting means in accordance with an output of said lock condition detecting means; and
    means for outputting said control signal to said second circuit, said outputting means being provided between said selecting means and said second circuit.

2. A signal synchronizing system, comprising:
    a first circuit having a plurality of sync output signals;
    a second circuit having a plurality of sync output signals corresponding to said sync signals of said first circuit; and
    means for receiving and synchronizing output signals from said first and second circuits and for generating a control signal to said second circuit,
    wherein said plurality of sync signals of each of said first and second circuits comprises a vertical sync signal, a horizontal sync signal and a dot clock signal.

3. The signal synchronizing system of claim 1, further comprising a plurality of low-pass filters connected in series to an output of each of said phase detectors.

4. The signal synchronizing system of claim 1, wherein said control signal outputting means comprises a low-pass filter and a voltage control oscillator connected in series to said low-pass filter.

5. A signal synchronizing system, comprising:
    a first circuit having a plurality of sync output signals;
    a second circuit having a plurality of sync output signals corresponding to said sync signals of said first circuit; and
    means for receiving and synchronizing output signals from said first and second circuits and for generating a control signal to said second circuit,
    wherein said first and second circuits output analog R, G and B signals, digital R, G and B signals, an NTSC signal and an NTSC RF signal.

6. The signal synchronizing system of claim 1, wherein said first circuit outputs a subject signal and said second circuit outputs a reference signal.

7. The signal synchronizing system of claim 6, further comprising means for comparing said subject signal of said first circuit with said reference signal of said second circuit.

8. A signal synchronizing system, comprising:
    a first circuit having a plurality of reference sync output signals;
    a second circuit having a plurality of subject sync output signals corresponding to the sync signals of said first circuit;
    synchronizing means for receiving output signals from said first and second circuits, for comparing said signals, and for generating a control signal to said second circuit, said synchronizing means including a count trigger generating portion and a comparing portion, said count trigger generating portion receiving sync signals from said second circuit and generating a sampling clock signal to said comparing portion.

* * * * *